United States Patent [19]

Okado et al.

[11] Patent Number: 4,719,531
[45] Date of Patent: Jan. 12, 1988

[54] OVERCURRENT PROTECTIVE CIRCUIT FOR MODULATED-CONDUCTIVITY TYPE MOSFET

[75] Inventors: Chihiro Okado, Fuchu; Yoshihiro Yamaguchi, Urawa; Akio Nakagawa, Hiratsuka, all of Japan

[73] Assignee: Kabushiki Kaisha Toshiba, Kawasaki, Japan

[21] Appl. No.: 863,515

[22] Filed: May 15, 1986

[30] Foreign Application Priority Data

May 15, 1985 [JP] Japan ................................ 60-103308
May 15, 1985 [JP] Japan ................................ 60-103311

[51] Int. Cl.$^4$ ............................................... H02H 3/24
[52] U.S. Cl. ...................................... 361/86; 361/91
[58] Field of Search ................ 361/18, 56, 86, 89, 361/91, 101, 88, 93, 94, 98, 100, 57; 323/276; 330/207 D

[56] References Cited

U.S. PATENT DOCUMENTS 3,886,410  5/1975  Seer, Jr. ............................ 323/276 X
3,982,173  9/1976  Berry et al. ........................ 361/56 X
4,415,945 11/1983  Deriot ................................ 361/100
4,551,779 11/1985  Murakami et al. ................ 361/91 X
4,600,963  7/1986  Hertrich et al. .................... 361/101

OTHER PUBLICATIONS

J. Baliga et al., "Modulated-Conductivity Devices Reduce Switching Losses", New Application, Technology reprinted from EDN, Sep. 1983.

*Primary Examiner*—A. D. Pellinen
*Assistant Examiner*—Todd E. DeBoer
*Attorney, Agent, or Firm*—Oblon, Fisher, Spivak, McClelland & Maier

[57] ABSTRACT

An overcurrent protective circuit for a modulated conductivity type MOSFET, i.e., a BIFET, which has a voltage detection circuit for detecting a voltage between the drain and source of the BIFET and a main switching circuit for lowering a voltage between the gate ad source of the BIFET and preventing the failure of the BIFET and delay of turn-on of the BIFET according to the output of the voltage detection circuit. The protective circuit produces a constant time delay before the main switching circuit becomes turned on during the initial turn-on period of the BIFET upon application of an ON-gate signal to the gate of the BIFET. The protection circuit thereby prevents, during the initial turn period of the BIFET, a situation where the main switching circuit is turned on but the BIFET is not turned on. The protective circuit further assures that after detection of an overvoltage across the source and drain of the BIFET as may be caused by a load failure, the BIFET gate is maintained at such a low voltage to assure at most a small current conduction through the BIFET even if a ringing voltage occurs across the BIFET.

14 Claims, 7 Drawing Figures

OVERCURRENT PROTECTIVE CIRCUIT FOR MODULATED-CONDUCTIVITY TYPE MOSFET

BACKGROUND OF THE INVENTION

1. Field of the Invention

This invention relates to an overcurrent protective circuit for a modulated-conductivity type MOSFET.

2. Description of Background

A modulated-conductivity type MOSFET (metal oxide semiconductor field-effect transistor) is a FET which is provided with a MOS gate input, operates in a bipolar mode, and has such advantages as rapid switching speed and low ON (saturation) voltage. This permits a high-power high-frequency control which has not been available by use of conventional bipolar transistors or MOSFETs, and allows compactness and low cost of various apparata to be realized. Hereinafter, the above-described modulated-conductivity type MOSFET is simply referred to as BIFET (Bipolar, mode FET).

FIG. 1 shows a basic chopper circuit of a BIFET, wherein reference numeral 1 designates a BIFET. In FIG. 1, the turn-on and turn-off operation of the BIFET 1 functions so as to supply power from a DC power source 2 to a load 3. The BIFET 1 is on-off controlled by a gate signal generating circuit 50 which has a gate power source 4 that supplies a positive voltage to the gate of the BIFET 1, a gate power source 5 that supplies a negative voltage to the same, and bipolar transistors 6 through 9 that amplify a control signal received at a control signal input terminal 10. When the control signal input terminal 10 of the gate signal generating circuit 50 receives a positive signal, the transistors 6 and 7 are turned on so as to supply a positive voltage from the gate power source 4 through an output terminal 11 to the gate of the BIFET 1, which is thereby turned on. When the control signal input terminal 10 receives a negative signal, the transistors 8 and 9 are turned on so as to supply a negative voltage from the gate power source 5 through the output terminal 11 to the gate of the BIFET 1, which is thereby turned off.

FIG. 2 is a graph illustrating one example of characteristics between a drain voltage $V_D$ and a drain current $I_D$, both of a BIFET. As shown, when operated with higher gate voltages $V_G$, ON voltages of the BIFET become lower, whereby power loss therein can be reduced.

In FIG. 1, when a short-circuit failure occurs within the load 3, the voltage between the drain and source of the BIFET 1 rises up to the voltage of the DC power source 2. As a result, power loss within the BIFET 1 becomes excessively large, thereby causing the BIFET 1 to be damaged. Should the BIFET 1 be operated with the gate voltages lower taking such a failure within the load 3 into consideration, as seen from FIG. 4, ON voltages of the BIFET 1 become higher, whereby the power loss within the BIFET during the ON state becomes larger.

To solve the above-mentioned problem, there is provided an overcurrent protective circuit shown in FIG. 3. In FIG. 3, between the drain and source of the BIFET 1, are connected resistors 12 and 13 in series, and a voltage between the drain and source is detected across the resistor 13. Between the gate and source of the BIFET 1, are connected a resistor 41 and a transistor 42 in series, and the base of the transistor 42 is connected through a zener diode 43 to the higher potential side of the resistor 13. The gate of the BIFET 1 is connected through a resistor 44 to the output terminal 11 of the gate signal generating circuit 50.

In operation, when a failure within the load 3 causes an overcurrent to flow through the BIFET 1, the ON voltage of the BIFET 1 rises. This ON voltage is divided by the resistors 12 and 13, and when the voltage across the resistor 13 exceeds the zener voltage value of the zener diode 43, a current flows into the base of the transistor 42. This causes the transistor 42 to be turned on, so that the voltage of the gate power source 4 becomes divided by the resistors 41 and 44 so as to be lowered. For example, assuming that the voltage of the gate power source 4 is 15 V and both the resistors 41 and 44 are 50 Ω, the gate voltage of the BIFET 1 is 15 V when operated in normal operation. However, after a short-circuit failure has occurred within the load 3, the gate voltage is lowered to 7.5 V, whereby a current that flows through the BIFET 1 can be reduced.

On the other hand, when the BIFET 1 is turned on with the load 3 which is in normal state, there exists, at the initial turn-on period thereof, a delay time of several tens of nanoseconds. Thus, during the period of several tens of nanoseconds from an instant at which a positive gate voltage is applied to the gate of the BIFET 1, the voltage of the DC power source 2 is applied between the drain and source of the BIFET 1. During this period, a current flows into the base of the transistor 42, so that the gate voltage of the BIFET 1 becomes lower value. However, as time advances, the ON voltage of the BIFET 1 is gradually lowered, and ultimately reaches a value of several volts. Should a voltage developed across the resistor 13 at this instant become lower than the zener voltage of the zener diodes 43, the transistor 42 becomes turned off and the gate voltage of the BIFET 1 rises up to the voltage of the gate power source 4, so that the BIFET 1 can be operated such that the ON voltage thereof becomes sufficiently lowered.

FIG. 4 is a graph illustrating the relationship between a drain current $I_D(max)$ and a drain-source voltage $V_D$ of a BIFET in the case when the BIFET is damaged due to an overcurrent that flows thereinto. In FIG. 4, the hatched portion is a region in which the BIFET is damaged. As can be seen from the graph, $I_D(max)$ is in inverse proportion to $V_D$, and it becomes significant that the overcurrent be reduced as low as possible particularly when the BIFET is utilized in a high voltage circuit. To achieve this, it is necessary that the gate voltage of the BIFET be restricted either below Vth (a minimum gate voltage to cause the BIFET to be in the ON-state) so as to cause the flow of current to cease, or below a value of approximately Vth+3 V so as to sufficiently reduce the current flow.

However, in the conventional protective circuit shown in FIG. 3, should the resistors 41 and 44 be determined such that the gate voltage of the BIFET 1 becomes less than or equal to Vth when an overcurrent flows into the BIFET 1, several problems are developed. First, as described above, at the initial turn-on period of the BIFET 1, the voltage of the DC power source 2 is applied between the drain and source of the BIFET 1, so that the transistor 42 is turned on, and at this instant the gate voltage of the BIFET 1 inevitably decreases to a level of less than or equal to Vth. As a result, the BIFET 1 does not become turned on, or the turn-on time thereof becomes extremely longer. Second, in the case when a failure within the load 3 causes the protective circuit to operate, an overcurrent that flows through the BIFET 1 decreases abruptly, so that a voltage applied to the BIFET 1 oscillates due to a stray inductance component of the circuit, and the voltage developed across the resistor 13 becomes temporarily lower than the zener voltage of the zener diode 43. At this instant, the transistor 42 becomes turned off, and a high gate voltage is applied again to the BIFET 1, thereby causing an overcurrent to flow. The above-described repetition induces oscillatory phenomena within the circuit.

SUMMARY OF THE INVENTION

It is an object of the present invention to provide a novel highly reliable overcurrent protective circuit for a BIFET.

The foregoing and other objects are achieved according to the present invention by providing an overcurrent protective circuit for a BIFET which has a voltage detection circuit for detecting a voltage between the drain and source of BIFET, and a main switching circuit for lowering a voltage between the gate and source of the BIFET and preventing the failure of the BIFET and delay of turn-on of the BIFET according to the output of the voltage detection circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
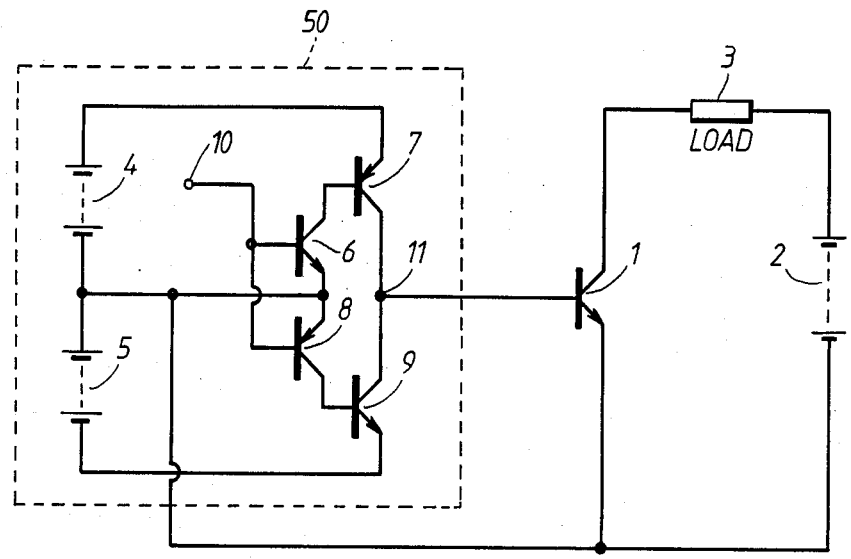
FIG. 1 is a diagram illustrating a basic circuit configuration for a BIFET.
Figure 2:
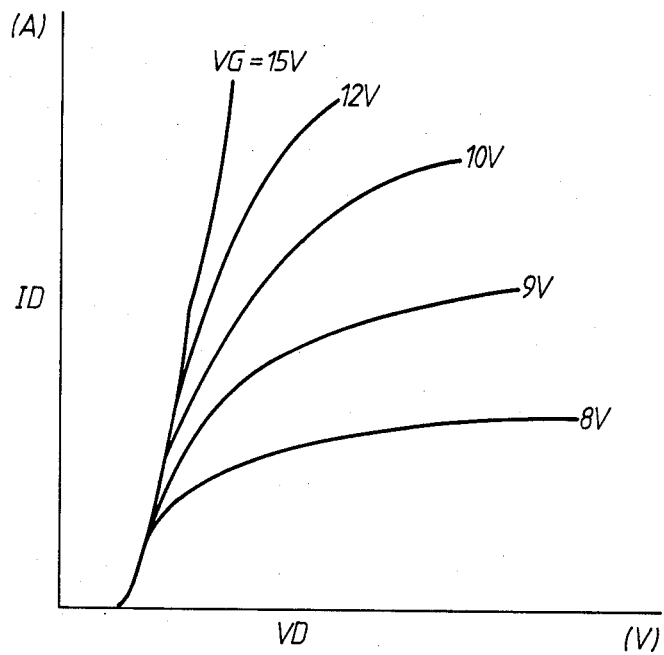
FIG. 2 is a graph illustrating voltage-current characteristics for a BIFET.
Figure 3:
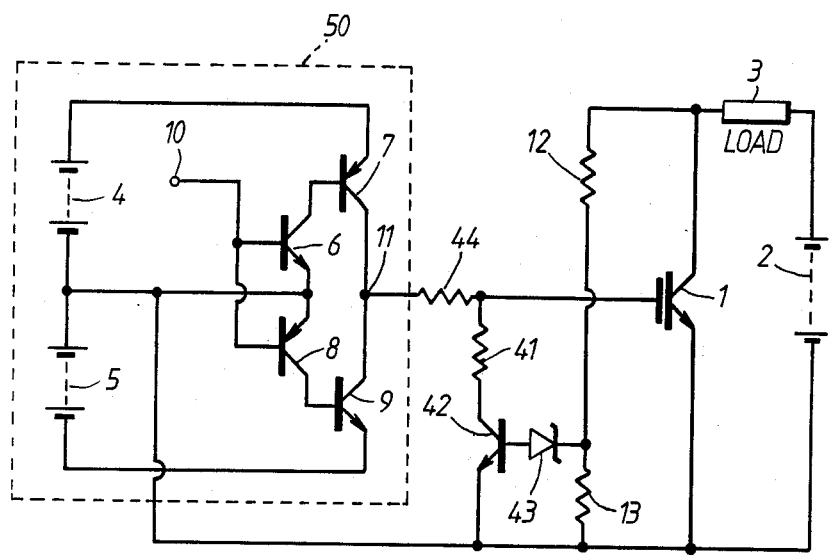
FIG. 3 is a diagram illustrating a circuit configuration for a BIFET provided with a conventional overcurrent protective circuit.
Figure 4:
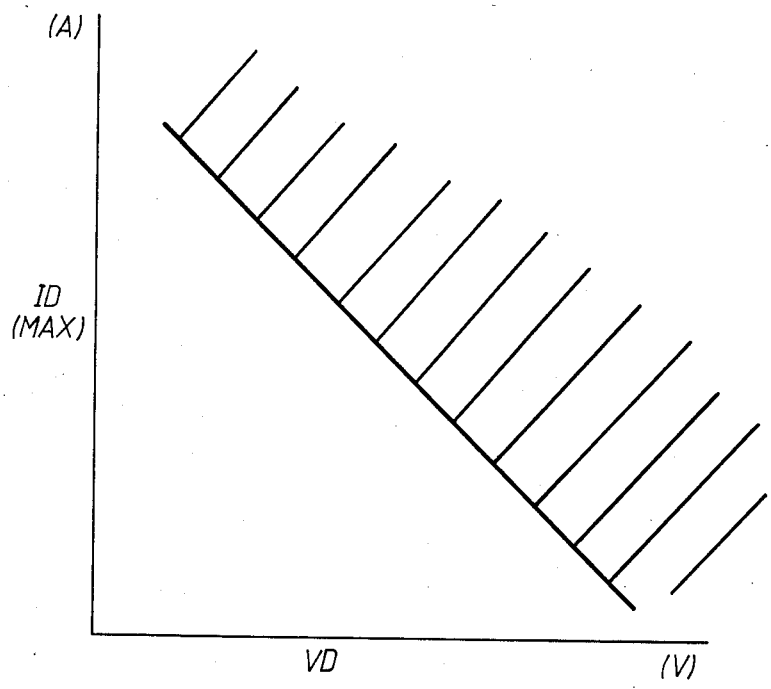
FIG. 4 is a graph illustrating an operational region wherein the BIFET is in danger of being damaged.
Figure 5:
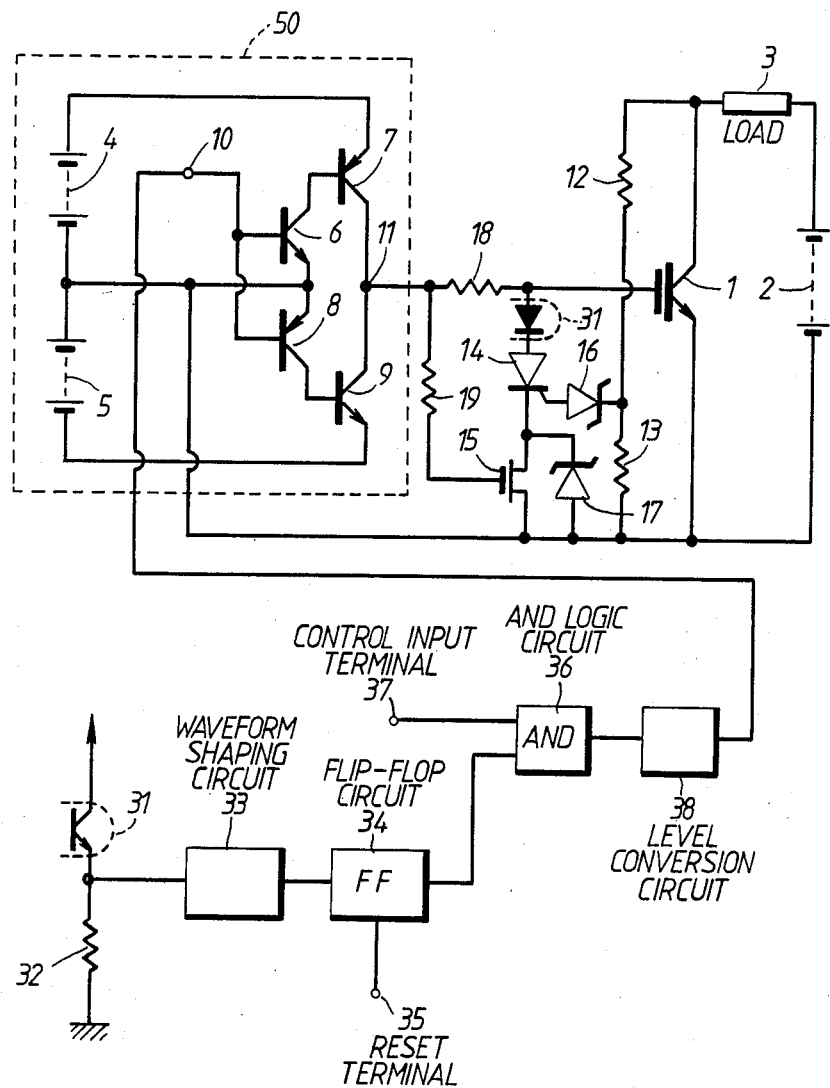
FIG. 5 is a diagram illustrating a BIFET circuit configuration of one embodiment according to the present invention.

Referring now to the drawings, wherein like reference numerals designate identical or corresponding parts throughout the several views, FIG. 5 shows a circuit configuration of one embodiment of an overcurrent protective circuit of the invention. In FIG. 5, the portions corresponding to those of the basic circuit shown in FIG. 1 are designated by identical reference numerals, so that detailed descriptions thereof are omitted. As a voltage detection circuit that detects a voltage between the drain and source of the BIFET 1, there are connected resistors 12 and 13 in series between the drain and source of the BIFET 1 in the same manner as that in FIG. 3. As a circuit that lowers a voltage between the gate and source of the BIFET 1 when an overcurrent flows therethrough, there is provided a series circuit of a thyristor 14 and a MOSFET 15 between the gate and source of the BIFET 1. The gate of the thyristor 14 is connected through a zener diode 16 that functions as a trigger diode to the high potential side of the resistor 13 which is the output terminal of the voltage detection circuit. Between the gate of the BIFET 1 and the output terminal 11 of the gate signal generating circuit 50, is provided a resistor 18, and between the gate of the MOSFET 15 and the output terminal 11 of the gate signal generating circuit 50, is also provided a resistor 19. A combination of the resistor 19 and the gate stray capacitance of the MOSFET 15 constitutes a delay circuit. Between the drain and source of the MOSFET 15, is connected a zener diode 17 so as to prevent an overvoltage.

A time constant of the delay circuit constituted by the resistor 19 and the gate stray capacitance of the MOSFET 15 is determined such that the MOSFET 15 does not become turned on before the BIFET 1 becomes turned on. Specifically, for example, the time constant of the delay circuit is determined such that the MOSFET 15 does not become turned on until an instant at which a voltage between the drain and source of the BIFET 1 lowers by 10% after reception of ON-gate signal.

In the above-described protective circuit, assume that a positive signal is applied to the control signal input terminal 10 of the gate signal generating circuit, whereby the BIFET 1 maintains the on-state, and that a short-circuit failure has occurred within the load 3. In this case, an overcurrent flows through the BIFET 1, whereby the ON-voltage thereof rises and is divided by the resistors 12 and 13 so as to be detected. Here, the MOSFET 15 is in the on-state by the effect of ON-gate signal from the gate signal generating circuit 50. When the voltage developed across the resistor 13 exceeds the zener voltage of the zener diode 16, a gate current flows through the thyristor 14, which in turn becomes turned on. Then, when the thyristor 14 is turned on, the voltage between the gate and source of the BIFET 1 becomes the sum of the ON-voltage of the thyristor 14 and the ON-voltage less than 2 volts. Vth, the threshold voltage of the BIFET 1, is approximately 5 volts, so that when an overcurrent flows through the BIFET 1, the voltage between the gate and source thereof can be restricted to less than the Vth, whereby the overcurrent can completely be interrupted. Further, once the thyristor 14 has become turned on, the thyristor 14 maintains the on-state as long as the anode thereof is at a positive potential, so that even when the overcurrent of the BIFET 1 is abruptly decreased causing voltage oscillation and the gate voltage of the thyristor 14 to be lowered, the voltage between the gate and source of the BIFET 1 can be restricted to less than Vth. Therefore, an overcurrent can never flow again into the BIFET 1.

Next, the operation during the initial turn-on period of the BIFET 1 will be described. When a positive control signal is applied to the control input terminal 10 of the gate signal generating circuit, a positive ON-gate signal is supplied from the output terminal 11 to the gate of the BIFET 1 through the resistor 18, while at the same time, an ON-gate signal is applied also to the gate of the MOSFET 15 through the resistor 19. In this case, the gate voltage of the MOSFET 15 is raised in accordance with the charging time constant determined by the resistor 19 and the gate stray capacitance, and when the gate voltage of the MOSFET 15 reaches the threshold voltage of the MOSFET 15, the MOSFET 15 becomes turned on. In this embodiment, the time required for the MOSFET 15 to become turned on is determined to be longer than the turn-on delay time of the BIFET 1, so that even while the ON-voltage in the initial turn-on period of the BIFET 1 is higher, the MOSFET 15 still remains in off-state resulting in that the thyristor 14 maintains the off-state. Therefore, to the gate of the BIFET 1, is supplied a high level ON-gate signal. As time passes, the MOSFET 15 becomes turned on, however, and at this instant, the ON-voltage of the BIFET 1 has already become sufficiently lower, so that the thyristor 14 can never be turned on. Therefore, in the overcurrent protective circuit of this embodiment, a high level ON-gate signal can be supplied to the gate of the BIFET 1 except the case when an overcurrent flows through the BIFET 1. Consequently a turn-on failure or a turn-on delay of the BIFET 1 can be prevented.

In FIG. 5, reference numeral 31 designates a photo-coupler having a light-emitting element connected in series with the thyristor 14, and having a light-receiving element connected to a resistor 32. The photo-coupler 31 functions to detect an instant at which both the thyristor 14 and a MOSFET 15 become turned on. A voltage across the resistor 32 is fed through a waveform shaping circuit 33 and a flip-flop circuit 34 into one of input terminals of an AND logic circuit 36. To the other input terminal 37 of the AND logic circuit 36, is supplied a control signal of logical state "1" or "0". Reference numeral 38 designates a level conversion circuit that converts an output of the AND logic circuit 36 into a signal with positive or negative polarity. The output terminal of the level conversion circuit 3 is connected to the control input terminal 10 of the gate signal generating circuit 50.

Next, the normal operation of the above-mentioned circuit configuration will be described. To the reset terminal 35 of the flip-flop circuit 34, is applied a signal so as to cause the output of the flip-flop circuit 34 to be invariably a logical "1" state. On the other hand, to the control input terminal 37 of the AND logic circuit 36, is applied a signal of logical state "1" or "0" so as to cause the BIFET 1 to be turned on or turned off. In this case, the output of the AND logic circuit 36 becomes the same logical state as that of the signal received at the control input terminal 37, and is fed into the level conversion circuit 38 so as to be converted into a signal with positive or negative polarity, and supplied to the control signal input terminal 10 of the gate signal generating circuit. As a result of this, a positive ON-gate signal or a negative OFF-gate signal is supplied from the output terminal 11 of the gate signal generating circuit to the gate of the BIFET 1.

Next, the operation in the case when an overcurrent flows through the BIFET 1 will be described. When an overcurrent flows through the BIFET 1, the thyristor 14 becomes turned on, whereby the gate voltage of the BIFET 1 is lowered. At this instant, a current flows through the light-emitting element side of the photo-coupler 31 connected in series to the thyristor 14, thereby developing a voltage across the resistor 32. This voltage is converted into a specified logic level signal within the waveform shaping circuit 33, and in turn, is fed into the flip-flop circuit 34. This causes the output of the flip-flop circuit 34 to be inverted to "0", and as a result, the output of the AND logic circuit 36 also becomes "0", so that to the control input terminal 10 of the gate signal generating circuit 50 is supplied a negative voltage. Consequently the supply of the ON-gate signal to the BIFET 1 is ceased.

As described above, in this embodiment, there can be provided not only an overcurrent protection for a BIFET, but also an automatic control such that when an overcurrent flows through the BIFET, the operation of a gate signal generating circuit is automatically ceased.

Figure 6:
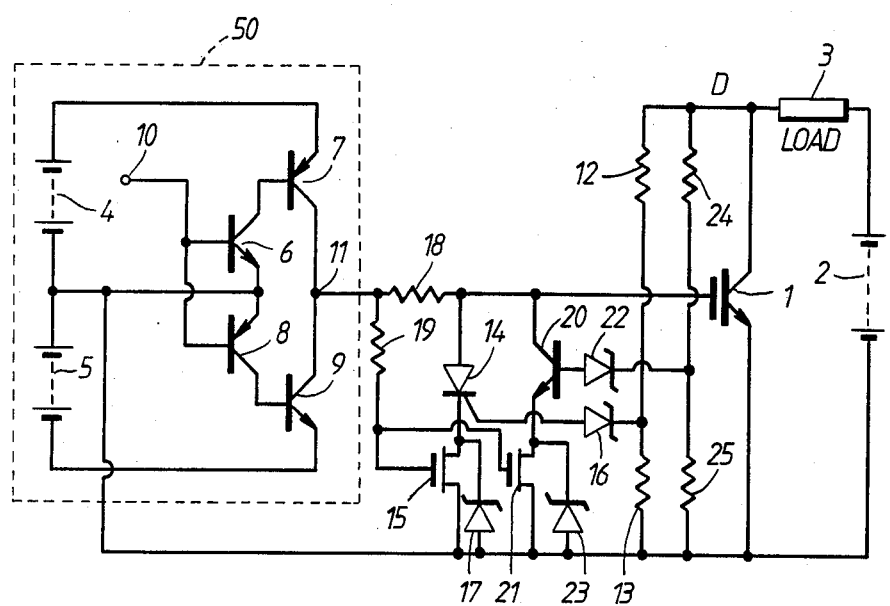
FIGS. 6, and 7 are diagrams illustrating BIFET circuit configurations of other embodiments of the present invention, respectively.

FIG. 6 shows a circuit configuration of an embodiment which is an improvement over the embodiment shown in FIG. 5. In the previous embodiment, there is necessitated a certain period of time from commencement to interruption of an overcurrent that flows through the BIFET 1. This time is determined by a time required for the thyristor 14 to become turned on, and is usually 2 to 3 $\mu$sec. During this period of time, the overcurrent flows continuously through the BIFET 1, which is therefore in danger of being damaged. In the FIG. 6 embodiment, the above-mentioned disadvantage is effectively overcome.

Namely, in addition to the protective circuit shown in FIG. 5, in FIG. 6 there is provided a series circuit of a bipolar transistor 20 and a MOSFET 21 between the gate and source of the BIFET 1. Between the drain and source of the BIFET 1, is additionally provided a series circuit of resistors 24 and 25 as a voltage detection circuit. The base of the transistor 20 is connected through a zener diode 22 to the high potential side of the resistor 25. The gate of the MOSFET 21 is, in common with the gate of the MOSFET 15, connected through the resistor 19 to the output terminal 11. A zener diode 23 is connected between the drain and source of the MOSFET 21 so as to prevent an overvoltage.

In the above-mentioned circuit, when a short-circuit failure occurs within the load 3, as described above, an overcurrent flows through the BIFET 1, whereby the ON-voltage thereof rises. This causes both the voltages respectively across the resistors 13 and 25 to be raised, and when these voltages respectively exceed the zener voltages of the zener diodes 16 and 22, currents respectively flow to the gate of the thyristor 14 and the base of the transistor 20. As described above, the thyristor 14 has a turn-on time of 2 to 3 $\mu$sec, however, and during this period, the transistor 20 first becomes turned on. Namely, the voltage between the gate and source of the BIFET 1 is lowered to the sum of the ON-voltage of the transistor 20 and the ON-voltage of the MOSFET 21, and this causes the overcurrent that flows through the BIFET 1 to be interrupted. When the overcurrent is interrupted, as described above, there is such a possibility that the voltage between the drain and source of the BIFET 1 oscillates. However, after a time of 2 to 3 $\mu$sec from commencement of the overcurrent, the thyristor 14 becomes completely turned on, so that the voltage between the gate and source of the BIFET 1 can be maintained below the Vth thereof, whereby the reoccurrence of the overcurrent within the BIFET 1 can be prevented.

As described above, in this embodiment, the BIFET 1 can be more effectively protected from the overcurrent compared to the previous embodiment.

Moreover, the circuit configuration that automatically controls the operation of the gate signal generating circuit shown in FIG. 5 can similarly be adapted to the circuit in the embodiment shown in FIG. 6.

Figure 7:
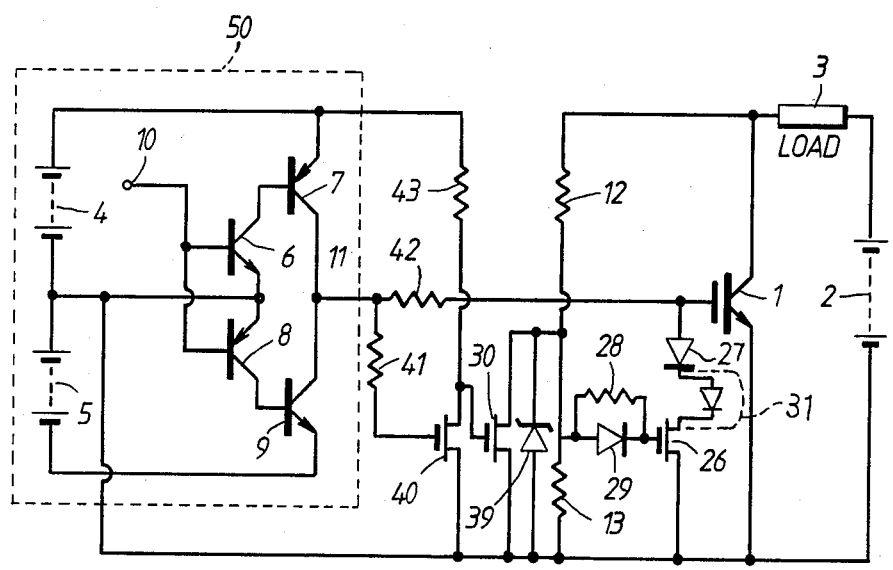

FIG. 7 shows a circuit configuration of another embodiment. A series circuit of a diode 27 and a MOSFET 26 is provided between the gate and source of the BIFET 1 so that when an overcurrent flows through the BIFET, the voltage between the gate and source thereof is lowered. The gate of the MOSFET 26 is connected through a parallel circuit of a resistor 28 and a diode 29 to the high potential side end of the resistor 13 which is the output terminal of the voltage detection circuit. The resistor 28 and the diode 29 together with the gate input capacitance of the MOSFET 26 constitute a specified time constant circuit. As a circuit that selectively short-circuits the high potential side of the resistor 13 which is the output terminal of the voltage detection circuit, there is provided a MOS-INVERTER that includes a MOSFET 40 and a resistor 43, and a MOSFET 30 which is controlled by the MOS-INVERTER. The input terminal of the MOS-INVERTER is connected through a resistor 41 to the output terminal 11 of the gate signal generating circuit 50. The resistor 41, together with the gate input capacitance of the MOSFET 40 constitutes a delay circuit. Between the drain and source of the MOSFET 30, is provided a zener diode 39 for overvoltage protection.

The time constant of the delay circuit constituted by the resistor 41 and the MOSFET 40 is determined such that the MOSFET 26 does not become turned on before the BIFET 1 becomes turned on, namely the MOSFET 30 remains turned on. Specifically, for example, the time constant of the delay circuit is determined such that the MOSFET 30 does not become turned off until an instant at which a voltage between the drain and source of the BIFET 1 lowers by 10% after reception of ON-gate signal.

In the above-described protective circuit, when a positive signal is applied to the control signal input terminal 10 of the gate signal generating circuit 50, an ON-gate signal is supplied from the output terminal 11 through the resistor 42 to the gate of the BIFET 1, which in turn, is turned on. While at the same time, an ON-gate signal is supplied through the resistor 41 also to the gate of the MOSFET 40, however, an instant at which the MOSFET 40 becomes turned on is delayed by virtue of the delay circuit constituted by the resistor 41 and the gate input capacitance of the MOSFET 40 by a specified time compared to an instant at which the BIFET 1 becomes turned on. When the MOSFET 40 becomes turned on, the MOSFET 30 connected in parallel with the resistor 13 becomes turned off. This means that the MOSFET 30 short-circuits both ends of the resistor 13 during the specified initial turn-on period of the BIFET 1.

When a negative control signal is applied to the control input terminal 10 of the gate signal generating circuit, a negative OFF-gate signal is produced from the output terminal 11 so as to turn off the BIFET 1. While at the same time, the negative OFF-gate signal is supplied also to the gate of the MOSFET 40, which in turn becomes turned off. Thus, the MOSFET 30 becomes turned on so as to short-circuit the resistor 13 of the voltage detection circuit.

As described above, in this overcurrent protective circuit, the MOSFET 30 remains turned on during the turn-off period and the specified initial turn-on period of the BIFET 1, whereby the high potential side of the resistor 13 which is the output terminal of the voltage detection circuit remains connected to the ground node.

Description is next made as to the operation in the FIG. 7 embodiment when an overcurrent flows through the BIFET 1 upon occurrence of failure within the load 3. When an overcurrent flows through the BIFET 1, the ON-voltage thereof is raised. At this instant, the MOSFET 30 provided in parallel with the resistor 13 of the voltage detection circuit is in the off state, and across the resistor 13, is obtained a voltage corresponding to the ON-voltage of the BIFET 1. This voltage is applied through the diode 29 to the gate of the MOSFET 26, and when the voltage exceeds the threshold voltage thereof, the MOSFET 26 becomes turned on. As a result, the voltage between the gate and source of the BIFET 1 is lowered to a value which is the sum of the ON-voltage of the MOSFET 26 and the forward voltage of the diode 27. The sum is determined as a value sufficiently lower than the threshold voltage of the BIFET 1, whereby the overcurrent that flows through the BIFET 1 is interrupted.

As described above, when the overcurrent is interrupted, the voltage between the drain and source of the BIFET 1 oscillates. However, in the circuit configuration of this embodiment, even when such oscillations exist, the BIFET 1 can never be turned on again, so that no overcurrent flows therethrough. The reasons for this are as follows. At the gate of the MOSFET 26 that short-circuits the gate and source of the BIFET 1, is provided the resistor 28 connected in parallel with the diode 29. When the voltage between the drain and source of the BIFET 1 oscillates causing the terminal voltage across the resistor 13 to be lowered, charge stored by the effect of the gate input capacitance of the MOSFET 26 is discharged through the resistor 28. However, in this embodiment, the time constant of this discharge is determined so large that the discharge time required for the gate voltage of the MOSFET 26 to reach Vth, the threshold voltage thereof, becomes longer than the oscillatory period of the voltage between the drain and source of the BIFET 1. Consequently, even when the voltage between the drain and source of the BIFET 1 becomes zero, the MOSFET 26 can never be turned off, and this prevents the BIFET 1 from turning on and conducting an overcurrent.

Moreover, in the circuit configuration of this embodiment, when operated in normal operation, as described above, the MOSFET 30 remains turned on for a specified time after application of ON-gate signal to the BIFET 1. Therefore, during the turn-on delay time of the BIFET 1, the high potential side of the resistor 13, which is the output terminal of the voltage detection circuit, is shortcircuited to the ground node, so that the MOSFET 26 can never be turned on, whereby a turn-on failure or turn-on delay of the BIFET 1 can be prevented.

Moreover, the photo-coupler circuit shown in FIG. 5 can similarly be adapted to the circuit in the embodiment shown in FIG. 7.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An overcurrent protective circuit including a BIFET having a source, a drain, and a gate connected to an output terminal of a gate signal generating circuit, comprising:
first voltage detection means for detecting a voltage between the drain and source of said BIFET; and
main switching means for instantaneously lowering a voltage between the gate and source of said BIFET according to the output of said voltage detection means and for preventing the failure of turn-on and the delay of turn-on of said BIFET, comprising:

a thyristor having an anode, a cathode and a gate, said anode connected to the gate of said BIFET;

a first zener diode connected to the gate of said thyristor;

a first MOSFET having a drain connected to the cathode of said thyristor, a source connected to the source of said BIFET, and a gate;

a first resistor means connected between the gate of said first MOSFET and said output terminal of said gate signal generating circuit, said first MOSFET having a gate capacitance which in combination with said first resistor means results in a delay in turn-on of said first MOSFET until after turn-on of said BIFET upon application of a turn-on signal to said output terminal of said gate signal generating circuit.

2. An overcurrent protective circuit according to claim 1, wherein the time constant of the first resistor means and the gate capacitance of said first MOSFET is predetermined so as to maintain said first MOSFET in the off-state during a period in which an ON-gate signal is not applied to the gate of said BIFET and during an initial turn-on period after application of the ON-gate signal until the voltage between the drain and source of said BIFET is lowered by at least 10% compared to that before application of the ON-gate signal to the gate of the BIFET.

3. An overcurrent protective circuit according to claim 1, wherein said first resistor means comprises:

a resistor connected between the output terminal of said gate signal generating circuit and the gate of said first MOSFET.

4. An overcurrent protective circuit according to claim 1, further comprising:

a photo coupler connected between the gate of said BIFET and the anode of said thyristor.

5. An overcurrent protective circuit according to claim 1, further comprising:

a subswitching means for lowering a voltage between the gate and source of said BIFET and preventing failure of said BIFET and delay of turn-on of said BIFET; and a second voltage detection means for detecting a voltage between the drain and source of said BIFET and having an output terminal connected to said subswitching means.

6. An overcurrent protective circuit according to claim 5, further comprising:

a first zener diode connected between the drain and source of said first MOSFET for preventing an overvoltage.

7. An overcurrent protective circuit according to claim 6, wherein said subswitching means comprising:

a bipolar transistor having a base, a collector and an emitter, the collector of which is connected to the gate of said BIFET;

a second zener diode connected between the base of said bipolar transistor and the output terminal of said second voltage detection means;

a second MOSFET having a gate and gate capacitance, a drain connected to the emitter of said bipolar transistor, and a source connected to the source of said BIFET; and a second resistor means connected to the gate of said second MOSFET.

8. An overcurrent protective circuit according to claim 7, wherein said second resistor means comprises:

a first resistor connected between the output terminal of said gate signal generating circuit and the gate of said second MOSFET.

9. An overcurrent protective circuit including a BIFET having a source, a drain, and a gate connected to an output terminal of a gate signal generating circuit, comprising:

first voltage detection means for detecting a voltage between the drain and source of said BIFET; and main switching means for instantaneously lowering a voltage between the gate and source of said BIFET according to the output of said voltage detection means and for preventing the failure of turn-on and the delay of turn-on of said BIFET;

wherein said main switching means comprises:

a first MOSFET having a source, a drain, and a gate connected to the source of said BIFET;

a first diode connected between the gate of said BIFET and the drain of said first MOSFET;

first resistor means connected between the gate of said first MOSFET and the output terminal of said voltage detection means, said first MOSFET having a gate capacitance which in combination with said first resistor means results in a delay in turn-off of said first MOSFET after a lowering of the drain voltage of said BIFET; and short-circuiting means for short-circuiting the output terminal of said voltage detections means to a predetermined potential during an off-period and a specified intitial turn-on period of said BIFET under the control of an output of said gate signal generating circuit so that turn-on of said BIFET occurs before turn-on of said first MOSFET during said initial turn-on period.

10. An overcurrent protective circuit according to claim 9, wherein said first resistor means comprises:

a resistor and a second diode connected in parallel with said resistor.

11. An overcurrent protective circuit according to claim 9, further comprising:

a photo-coupler connected between the gate of said BIFET and the anode of said first diode.

12. An overcurrent protective circuit according to claim 9, wherein said short-circuiting means comprising:

a second MOSFET for short-circuiting the output terminal of said voltage detection means to said predetermined potential;

a MOS INVERTER including a third MOSFET having a source, a drain and a gate and gate capacitance, said source and drain thereof connected across the gate and drain of said second MOSFET, and a second resistor means connected between the output terminal of said gate signal generating circuit and the gate of said third MOSFET.

13. An overcurrent protective circuit according to claim 12, wherein said second resistor means comprises:

a second resistor connected between the output terminal of said gate signal generating circuit and the gate of said third MOSFET.

14. An overcurrent protective circuit according to claim 13, further comprising:

a zener diode connected between the drain and source of said second MOSFET for preventing an overvoltage.

* * * * *